US010991821B2

(12) United States Patent
Hoshi et al.

(10) Patent No.: US 10,991,821 B2
(45) Date of Patent: Apr. 27, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yasuyuki Hoshi, Matsumoto (JP); Keishirou Kumada, Matsumoto (JP); Yuichi Hashizume, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 26 days.

(21) Appl. No.: 16/233,802

(22) Filed: Dec. 27, 2018

(65) Prior Publication Data
US 2019/0131443 A1 May 2, 2019

Related U.S. Application Data

(63) Continuation of application No. PCT/JP2017/042929, filed on Nov. 29, 2017.

(30) Foreign Application Priority Data

Jan. 17, 2017 (JP) .................................. 2017-005669

(51) Int. Cl.
*H01L 29/78* (2006.01)
*H01L 29/32* (2006.01)
(Continued)

(52) U.S. Cl.
CPC ...... *H01L 29/7802* (2013.01); *H01L 29/0696* (2013.01); *H01L 29/1095* (2013.01);
(Continued)

(58) Field of Classification Search
CPC ............. H01L 29/7802; H01L 29/7804; H01L 29/4238; H01L 29/32
See application file for complete search history.

(56) References Cited

U.S. PATENT DOCUMENTS 6,048,759 A * 4/2000 Hshieh ................ H01L 29/1095
438/206
2005/0156267 A1 * 7/2005 Mori .................... H01L 29/7804
257/467
(Continued)

FOREIGN PATENT DOCUMENTS

| JP | 2011-61064 A | 3/2011 |
|---|---|---|
| JP | 2013-26563 A | 2/2013 |

(Continued)

OTHER PUBLICATIONS

Loredana Freda Albanese, Characterization, Modeling and Simulation of 4H-SiC Power Diodes, Università degli Studi di Salerno, 2010 (Year: 2010).*

(Continued)

*Primary Examiner* — Shih Tsun A Chou

(57) ABSTRACT

A semiconductor device includes a semiconductor substrate, a first semiconductor layer of a first conductivity type, a second semiconductor layer of a second conductivity type, a first semiconductor region of the first conductivity type, a second semiconductor region of the second conductivity type, a gate electrode, a first electrode, and a gate electrode pad. A first lower region opposing the gate electrode pad in a depth direction has a carrier recombination rate that is lower than that of a second lower region opposing the first electrode in the depth direction. With such a configuration, when high electric potential is applied to a source electrode and a built-in PN diode is driven, the generation of crystal defects may be suppressed.

10 Claims, 12 Drawing Sheets

(51) Int. Cl.
- *H01L 29/10* (2006.01)
- *H01L 29/66* (2006.01)
- *H01L 29/06* (2006.01)
- *H01L 29/423* (2006.01)
- *H01L 29/167* (2006.01)
- *H01L 29/739* (2006.01)
- *H01L 29/16* (2006.01)
- *H01L 29/861* (2006.01)

(52) U.S. Cl.
 CPC ........... *H01L 29/167* (2013.01); *H01L 29/32* (2013.01); *H01L 29/4238* (2013.01); *H01L 29/66068* (2013.01); *H01L 29/7804* (2013.01); H01L 29/1608 (2013.01); H01L 29/66333 (2013.01); H01L 29/7395 (2013.01); H01L 29/8611 (2013.01)

(56) References Cited

U.S. PATENT DOCUMENTS

| | | | |
|---|---|---|---|
| 2005/0263842 A1* | 12/2005 | Matsui | H01L 29/32 257/453 |
| 2013/0026494 A1 | 1/2013 | Oritsuki et al. | |
| 2013/0187240 A1 | 7/2013 | Takano | |
| 2015/0263115 A1* | 9/2015 | Hiyoshi | H01L 21/049 257/77 |
| 2017/0025524 A1 | 1/2017 | Kinoshita et al. | |
| 2018/0241194 A1* | 8/2018 | Fuisting | G01R 31/3277 |

FOREIGN PATENT DOCUMENTS

| | | |
|---|---|---|
| JP | 2013-152981 A | 8/2013 |
| JP | 2014-99444 A | 5/2014 |
| JP | 2016-58498 A | 4/2016 |
| WO | 2016/039071 A1 | 3/2016 |

OTHER PUBLICATIONS

Baliga, B. Jayant, "Silicon Carbide Power Devices", World Scientific Publishing Co., Mar. 30, 2006, p. 61-69.

Shenai, K., et al., "Optimum Semiconductors for High-Power Electronics", IEEE Transactions on Electron Devices, vol. 36, No. 9, Sep. 1989, pp. 1811-1823.

International Search Report dated Jan. 23, 2018 in corresponding International Application No. PCT/JP2017/042929.

Written Opinion of the International Searching Authority dated Jan. 23, 2018 in corresponding International Application No. PCT/JP2017/042929.

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2017/042929 filed on Nov. 29, 2017 which claims priority from a Japanese Patent Application No. 2017-005669 filed on Jan. 17, 2017, the contents of which are incorporated herein by reference.

BACKGROUND

1. Field

Embodiments of the invention relate to a semiconductor device and a method of manufacturing a semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics (for example, refer to K. Shenai, et al, "Optimum Semiconductors for High-Power Electronics", IEEE Transactions on Electron Devices, Sep. 1989, Vol. 36, No. 9, pp. 1811-1823).

Silicon carbide is chemically a very stable material, has a wide bandgap of 3 eV, and can be used very stably as a semiconductor material even at high temperatures. Further, silicon carbide has a critical electric field strength that is ten times that of silicon or greater, and has a high possibility of exceeding the material limit of silicon. Therefore, future growth is strongly expected for power semiconductor applications, particularly vertical MOSFETs. Especially, a vertical SiC-MOSFET is expected with a low ON resistance and a high breakdown voltage.

FIG. 11 is a cross-sectional view of a conventional vertical SiC-MOSFET. As depicted in FIG. 11, on a front surface of an $n^+$-type silicon carbide substrate 101, an $n^-$-type silicon carbide epitaxial layer 102 is deposited and at a surface of the $n^-$-type silicon carbide epitaxial layer 102, a p-type base layer 103 is selectively provided. Further, at a surface of the p-type base layer 103, an $n^+$-type source region 104 and a $p^+$-type contact region 105 are selectively provided.

At surfaces of the p-type base layer 103 and the $n^+$-type source region 104, a gate electrode 108 is provided via a gate insulating film 106. Further, a source electrode 1010 is provided on surfaces of the $n^-$-type silicon carbide epitaxial layer 102, the $p^+$-type contact region 105, and the $n^+$-type source region 104. Further, on a rear surface of the $n^+$-type silicon carbide substrate 101, a drain electrode 1014 is provided.

FIG. 11 is a cross-sectional view of a structure of an active region in which an element structure is formed and current flows during an ON state. Herein, a gate pad part 1020 is a region that is isolated from a $p^+$-type contact region by an insulating film 107 and an interlayer insulating film 109, where a gate electrode pad 1011 that is electrically connected with the gate electrode 108 is provided. The gate pad part 1020 is a region not used as a main element.

In the MOSFET of the structure depicted in FIG. 11, when voltage less than a gate threshold voltage Vth is applied to the gate electrode 108 in a state where with respect to the source electrode 1010, positive voltage is applied to the drain electrode 1014, a PN junction between a p-type base layer 103 and the $n^-$-type silicon carbide epitaxial layer 102 is in a reversed bias state and therefore, current does not flow. Meanwhile, when voltage equal to or higher than the gate threshold voltage Vth is applied to the gate electrode 108, at a surface of the p-type base layer 103 directly beneath the gate electrode 108, current flows due to the formation of an n-type inversion layer (channel), whereby switching operation of the MOSFET by the voltage applied to the gate electrode 108 is enabled. When the MOSFET is OFF, high electric potential is applied to the source electrode 1010, whereby a built-in PN (pin) diode constituted by the p-type base layer 103, the $n^+$-type silicon carbide substrate 101, and the $n^-$-type silicon carbide epitaxial layer 102 may be driven.

Further, there is a technique of reducing a forward voltage Vf of a built-in diode and a PN diode formed beneath the gate pad and reducing loss during ON operation of a built-in diode, by a diode-dedicated metal electrode formed beneath a gate pad (for example, refer to Japanese Laid-Open Patent Publication No. 2016-58498).

SUMMARY

According to an embodiment of the present invention, a semiconductor device includes a semiconductor substrate of a first conductivity type; a first semiconductor layer of the first conductivity type, provided on a front surface of the semiconductor substrate, the first semiconductor layer having an impurity concentration that is lower than that of the semiconductor substrate; a second semiconductor layer of a second conductivity type, selectively provided in a surface layer of the first semiconductor layer on a first side of the first semiconductor layer, opposite a second side of the first semiconductor layer facing toward the semiconductor substrate; a first semiconductor region of the first conductivity type, selectively provided in a surface layer of the second semiconductor layer on a first side of the second semiconductor layer, opposite a second side of the second semiconductor layer facing toward the semiconductor substrate; a second semiconductor region of the second conductivity type, selectively provided in the surface layer of the second semiconductor layer on the first side of the second semiconductor layer, the second semiconductor region having an impurity concentration that is higher than that of the second semiconductor layer; a gate electrode provided, via a gate insulating film, at least at a part of a surface of the second semiconductor layer sandwiched between the first semiconductor region and the first semiconductor layer; a first electrode provided on surfaces of the first semiconductor region and the second semiconductor layer; a second electrode provided on a rear surface of the semiconductor substrate; and a gate electrode pad electrically connected with the gate electrode. A first lower region, opposing the gate electrode pad in a depth direction, has a lower carrier recombination rate than a second lower region, opposing the first electrode in the depth direction.

In the embodiment, the first lower region is the second semiconductor layer whose impurity concentration is at least 10 times lower than that of the second lower region.

In the embodiment, the first lower region is a third semiconductor layer of the second conductivity type, selectively provided in the surface layer of the first semiconductor layer on the first side of the first semiconductor layer, the third semiconductor layer having an impurity concentration that is at least 10 times lower than that of the second lower region. The third semiconductor layer is thinner than the second semiconductor layer.

In the embodiment, the first lower region is the first semiconductor layer.

In the embodiment, in an active region in which main current flows during an ON state, a first region is not used as a main element. A second region opposing the first region in the depth direction has a same structure as the first lower region.

In the embodiment, the first region includes a current sensor pad part, a temperature sensor pad part and an arithmetic circuit part.

In the embodiment, a lifetime killer region, in which a lifetime killer is introduced, is provided in the first lower region.

In the embodiment, the third semiconductor layer has a depth equal to that of the second semiconductor region in an active region in which main current flows during an ON state, the third semiconductor layer surrounding the gate electrode pad.

According to another embodiment of the present invention, a method of manufacturing a semiconductor device includes forming a first semiconductor layer of a first conductivity type on a front surface of a semiconductor substrate of the first conductivity type, the first semiconductor layer having an impurity concentration that is lower than that of the semiconductor substrate; selectively forming a second semiconductor layer of a second conductivity type in a surface layer of the first semiconductor layer on a first side of the first semiconductor layer, opposite a second side of the first semiconductor layer facing toward the semiconductor substrate; selectively forming a first semiconductor region of the first conductivity type in a surface layer of the second semiconductor layer on a first side of the second semiconductor layer, opposite a second side of the second semiconductor layer facing toward the semiconductor substrate; selectively forming a second semiconductor region of the second conductivity type in the surface layer of the second semiconductor layer on the first side of the second semiconductor layer, the second semiconductor region having an impurity concentration that is higher than that of the second semiconductor layer; forming, via a gate insulating film, a gate electrode at least at a part of a surface of the second semiconductor layer sandwiched between the first semiconductor region and the first semiconductor layer; forming a first electrode on surfaces of the first semiconductor region and the second semiconductor layer; forming a second electrode on a rear surface of the semiconductor substrate; and forming a gate electrode pad electrically connected with the gate electrode. A first lower region, opposing the gate electrode pad in a depth direction, is formed to have a lower carrier recombination rate than a second lower region, opposing the first electrode in the depth direction.

Objects, features, and advantages of the present invention are specifically set forth in or will become apparent from the following detailed description of the invention when read in conjunction with the accompanying drawings.

DESCRIPTION OF EMBODIMENTS

Figure 11:
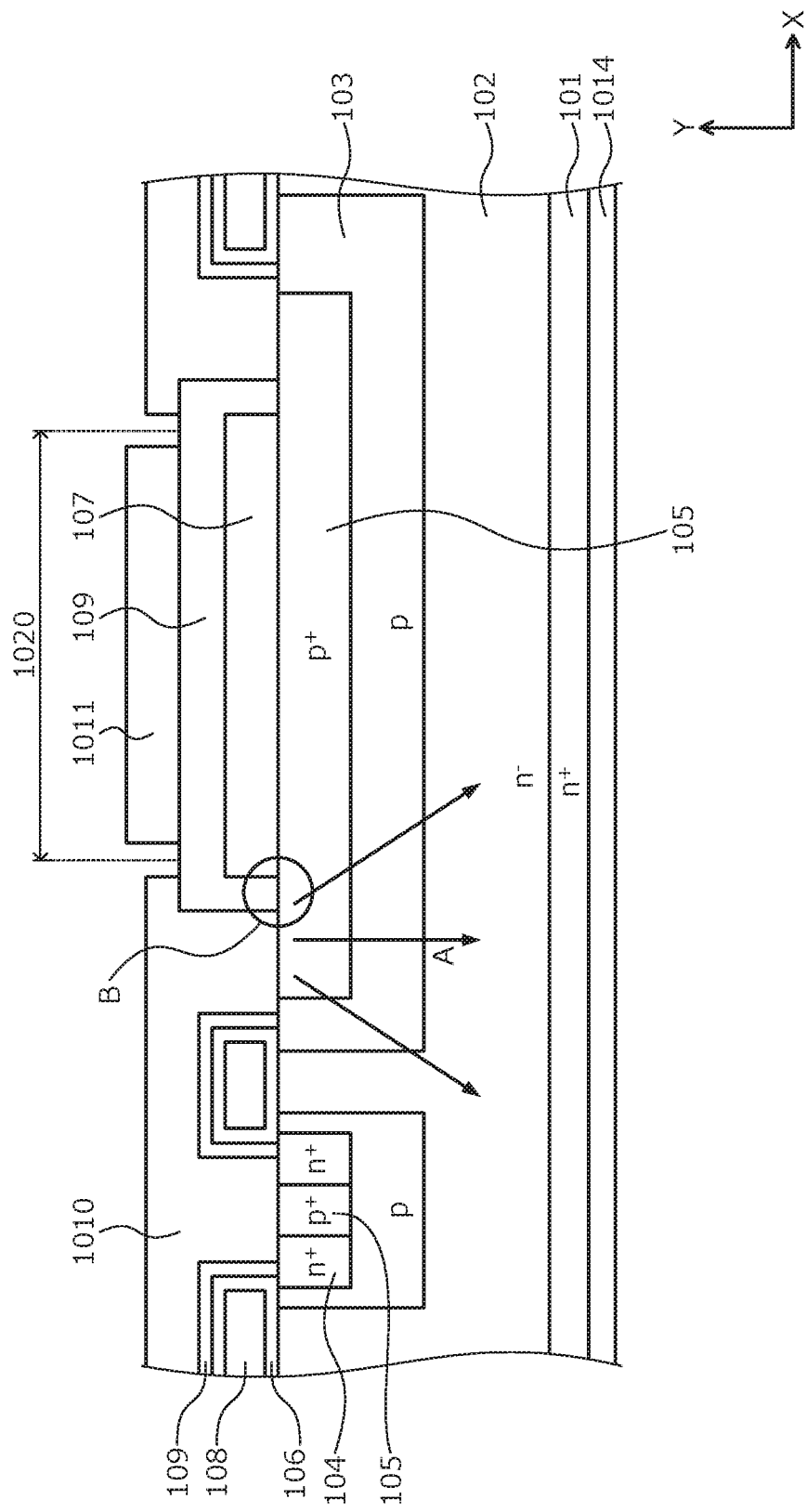
FIG. 11 is a cross-sectional view of a conventional vertical SiC-MOSFET.

First, problems associated with the related techniques will be discussed. Here, when high electric potential is applied to the source electrode 1010 and a built-in PN diode is driven, current flows in the built-in PN diode (for example, refer to A in FIG. 11). In a vertical SiC-MOSFET, in a vertical direction (Y-axis direction in FIG. 11), electric potential is the same and therefore, current spreads in concentric circles. At this time, in a region in which the gate electrode pad 1011 is provided, at a top (positive direction along Y-axis), the interlayer insulating film 109 is provided and therefore, carriers are unable to escape to the top.

Therefore, carriers concentrate at both ends (for example, refer to B in FIG. 11) of the gate electrode pad 1011. In this case, a rate of conductivity modulation increases at this site, facilitating crystal defect generation. A problem arises in that due to the generated crystal defects, the ON resistance increases and the forward voltage Vf of the built-in PN diode and the threshold voltage Vth of the MOSFET vary.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1A:
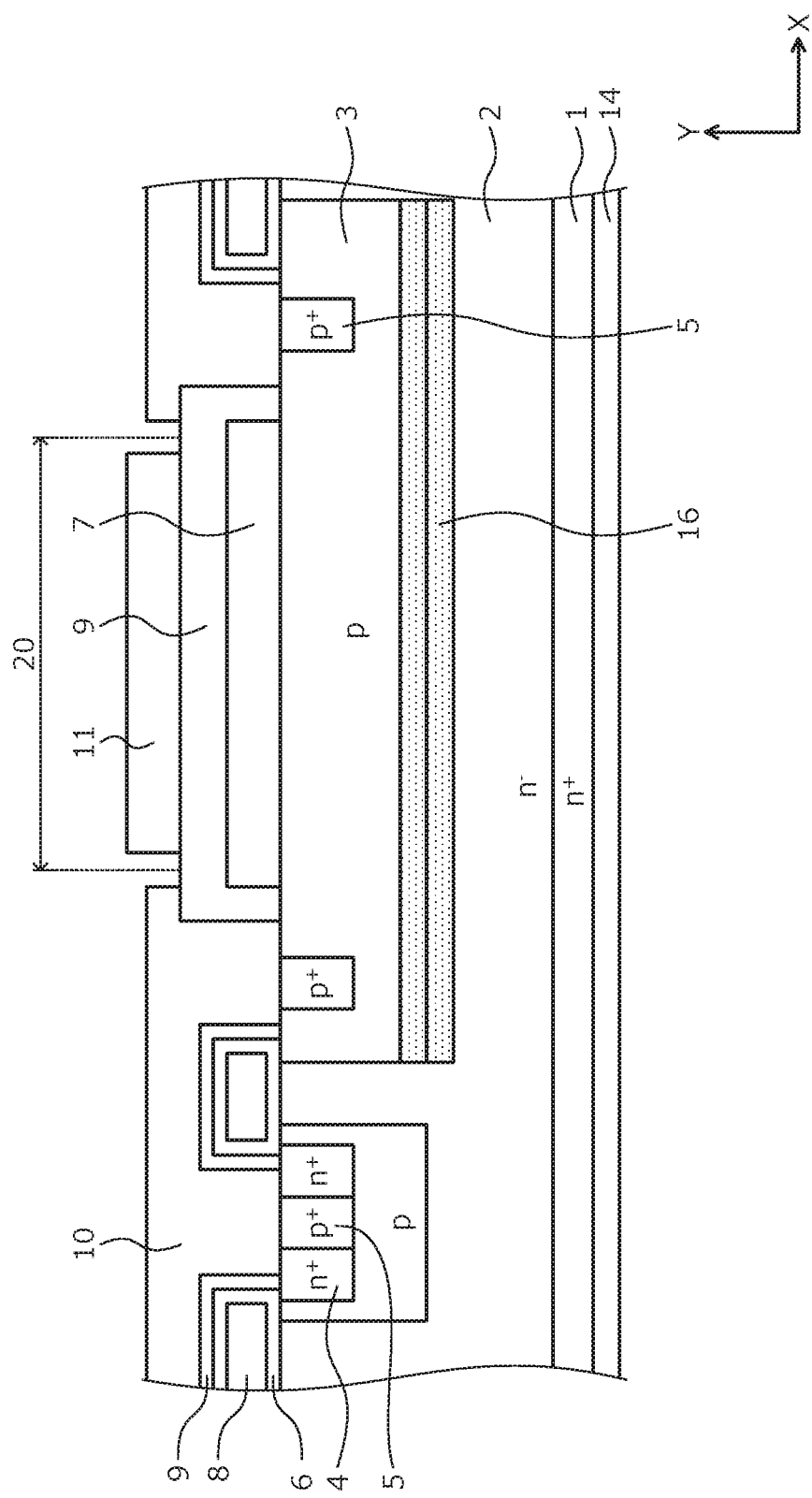
FIG. 1A is a cross-sectional view of a configuration of a silicon carbide semiconductor device according to a first embodiment.
Figure 1B:
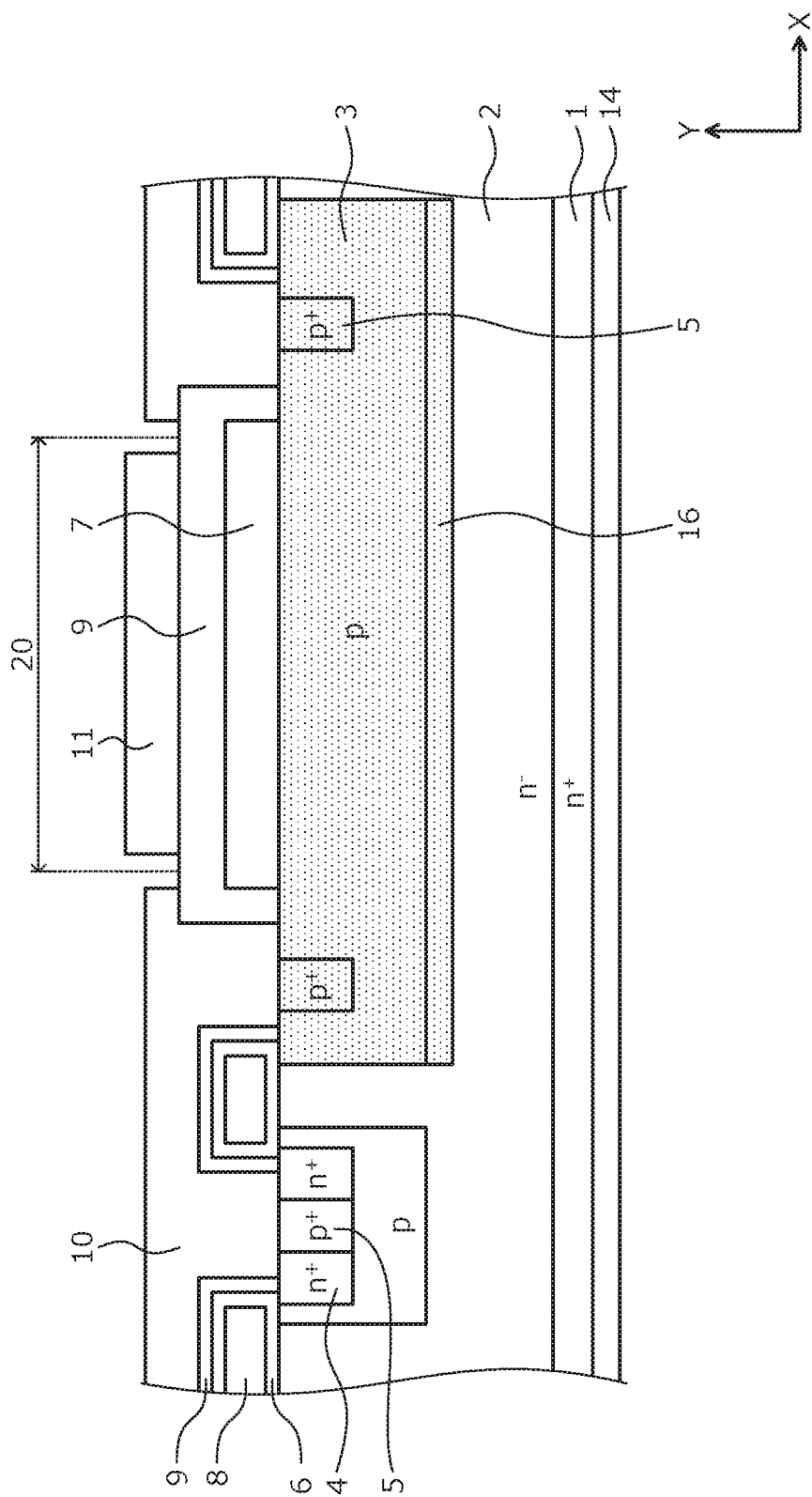
FIG. 1B is a cross-sectional view of the configuration of the silicon carbide semiconductor device according to the first embodiment.

A semiconductor device according to an embodiment of the present invention is configured using a wide-bandgap semiconductor material having a bandgap that is wider than that of silicon. In a first embodiment, a silicon carbide semiconductor device fabricated using, for example, silicon carbide (SiC) as a wide-bandgap semiconductor material will be described taking a MOSFET as an example. FIGS. 1A and 1B are cross-sectional views of a configuration of the silicon carbide semiconductor device according to the first embodiment.

As depicted in FIGS. 1A and 1B, in the silicon carbide semiconductor device according to the first embodiment, on a main surface (front surface) of an n$^+$-type silicon carbide substrate (semiconductor substrate of a first conductivity type) 1, an n$^-$-type silicon carbide epitaxial layer (first semiconductor layer of the first conductivity type) 2 is deposited.

The n$^+$-type silicon carbide substrate 1 is a silicon carbide single-crystal substrate doped with, for example, nitrogen (N). The n$^-$-type silicon carbide epitaxial layer 2 is a low-concentration n-type drift layer doped with, for example, nitrogen and has an impurity concentration that is lower than that of the n$^+$-type silicon carbide substrate 1. Hereinafter, the n$^+$-type silicon carbide substrate 1 alone or a combination of the n$^+$-type silicon carbide substrate 1 and the n$^-$-type silicon carbide epitaxial layer 2 is regarded as a silicon carbide semiconductor base.

As depicted in FIGS. 1A and 1B, in the silicon carbide semiconductor device according to the first embodiment, the n$^+$-type silicon carbide substrate 1 constitutes a drain region and a drain electrode (second electrode) 14 is provided on a surface (rear surface of the silicon carbide semiconductor base) on a first side of the n$^+$-type silicon carbide substrate 1, opposite a second side of the n$^+$-type silicon carbide substrate 1 facing toward the n$^-$-type silicon carbide epitaxial layer 2. Further, a drain electrode pad (not depicted) for connection with an external device is provided.

On a front surface side of the silicon carbide semiconductor base, a MOS (insulated gate constituted by a metal oxide film semiconductor) structure (element structure) is formed. In particular, a p-type base layer (second semiconductor layer of a second conductivity type) 3 is selectively formed in a surface layer of the n$^-$-type silicon carbide epitaxial layer 2 on a first side (the front surface side of the silicon carbide semiconductor base) of the n$^-$-type silicon carbide epitaxial layer 2, opposite a second side of the n$^-$-type silicon carbide epitaxial layer 2 facing toward the n$^+$-type silicon carbide substrate 1. The p-type base layer 3 is doped with, for example, aluminum (Al).

At a surface of the p-type base layer 3, an n$^+$-type source region (first semiconductor region of the first conductivity type) 4 and a p$^+$-type contact region (second semiconductor region of the second conductivity type) 5 are provided. Further, the n$^+$-type source region 4 and the p$^+$-type contact region 5 are in contact with each other. The n$^+$-type source region 4 is disposed at an outer periphery of the p$^+$-type contact region 5.

Further, at a surface of a part of the p-type base layer 3 sandwiched between the n$^+$-type source region 4 and the n$^-$-type silicon carbide epitaxial layer 2, the gate electrode 8 is provided via a gate insulating film 6. The gate electrode 8 may be provided at a surface of the n$^-$-type silicon carbide epitaxial layer 2, via the gate insulating film 6.

In FIGS. 1A and 1B, while only one and a half MOS structures are depicted, plural MOS structures may be disposed in parallel.

The interlayer insulating film 9 is provided on the front surface side of the silicon carbide semiconductor base overall so as to cover the gate electrode 8. A source electrode (first electrode) 10 is in contact with the n$^+$-type source region 4 and the p$^+$-type contact region 5, via a contact hole opened in the interlayer insulating film 9. The source electrode 10 is electrically insulated from the gate electrode 8 by the interlayer insulating film 9. On the source electrode 10, an electrode pad (not depicted) is provided.

FIGS. 1A and 1B depict a structure of an active region in which an element structure is formed and through which current flows during an ON state. Herein, a gate pad part 20 is a region in which a gate electrode pad 11 is provided that is electrically connected with the gate electrode 8 and is a region that is not used as a main element and in which no MOS structure is formed. In the gate pad part 20, at a surface of the silicon carbide semiconductor base, the insulating film 7 is provided, at a surface thereof, the interlayer insulating film 9 is provided, and at a surface thereof, the gate electrode pad 11 is provided.

In the gate pad part 20, a region (for example, the p-type base layer 3 beneath the insulating film 7, hereinafter, lower region) of the silicon carbide semiconductor base, opposing the gate electrode pad 11 in a depth direction (direction from the source electrode 10 to the drain electrode 14) has a carrier recombination rate that is lower than that of a semiconductor region (for example, the p$^+$-type contact region 5) opposing the source electrode 10 in the depth direction. In this manner, at the lower region, since the carrier recombination rate is low, when high electric potential is applied to the source electrode 10 and the built-in PN diode is driven, current flowing in the lower region decreases. Therefore, concentration of current in the lower region may be decreased, the rate of conductivity modulation may be lowered, and the generation of crystal defects may be reduced.

In particular, in the lower region, the p$^+$-type contact region 5 is not provided and the p-type base layer 3 is provided. The p$^+$-type contact region 5 is provided only at a part of the contact hole for the source electrode 10. An impurity concentration of the p-type base layer 3 is 10 times lower than an impurity concentration of the p$^+$-type contact region 5. For example, the impurity concentration of the p$^+$-type contact region 5 is in a range from $1\times10^{17}$ to $1\times10^{19}$/cm$^3$, and the impurity concentration of the p-type base layer 3 is in a range from $1\times10^{16}$ to $1\times10^{18}$/cm$^3$. In this manner, the impurity concentration is 10 times lower, enabling the carrier recombination rate of the lower region to be reduced. Further, while the impurity concentration of the p+-type contact region 5 may be reduced and the carrier recombination rate may be lowered, contact resistance increases and therefore, lowering the impurity concentration of the p+-type contact region 5 is not desirable.

Further, in the lower region, a lifetime killer region 16 may be provided in which a lifetime killer constituting a recombination center for minority carriers is implanted. For example, as depicted in FIG. 1A, the lifetime killer region 16 may be provided near an interface of the p-type base layer 3 and the n−-type silicon carbide epitaxial layer 2. Further, as depicted in FIG. 1B, the lifetime killer region 16 may be provided so as to overlap the p-type base layer 3. The carrier recombination rate of the lower region is reduced by the lifetime killer region 16. Further, the lifetime killer is a lattice defect that may be formed by, for example, protons (H+) or helium (He). Further, the lifetime killer may be an element that reduces lifetime such as, for example, gold (Au) or platinum (Pt).

Figure 2:
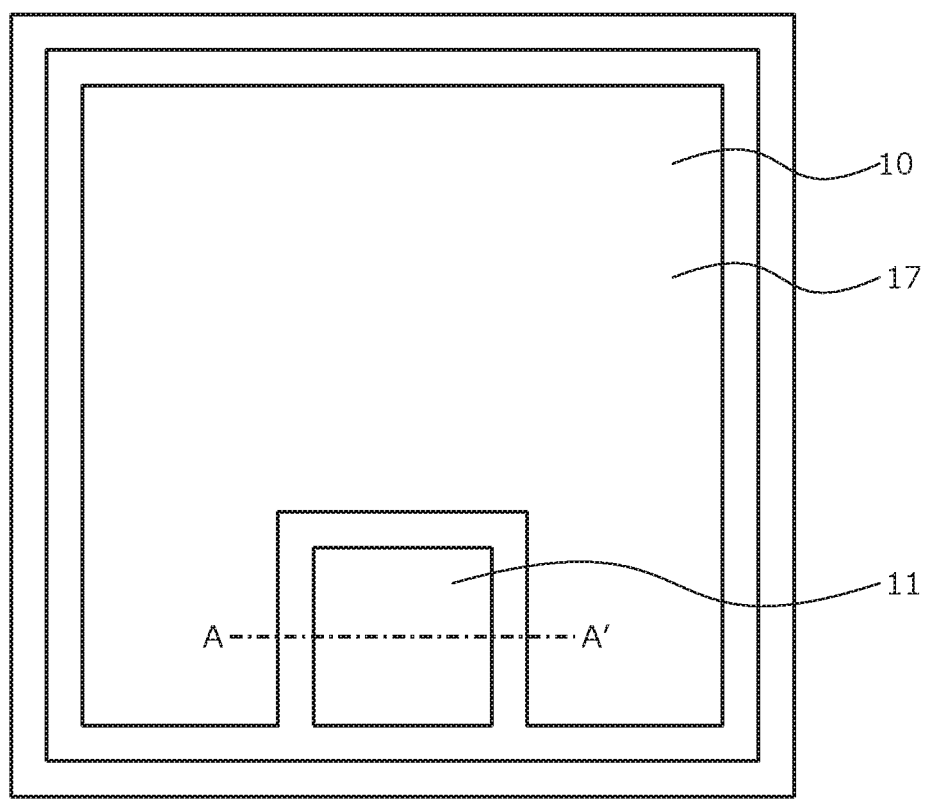
FIG. 2 is a top view of a structure of the silicon carbide semiconductor device according to the first embodiment.
Figure 3:
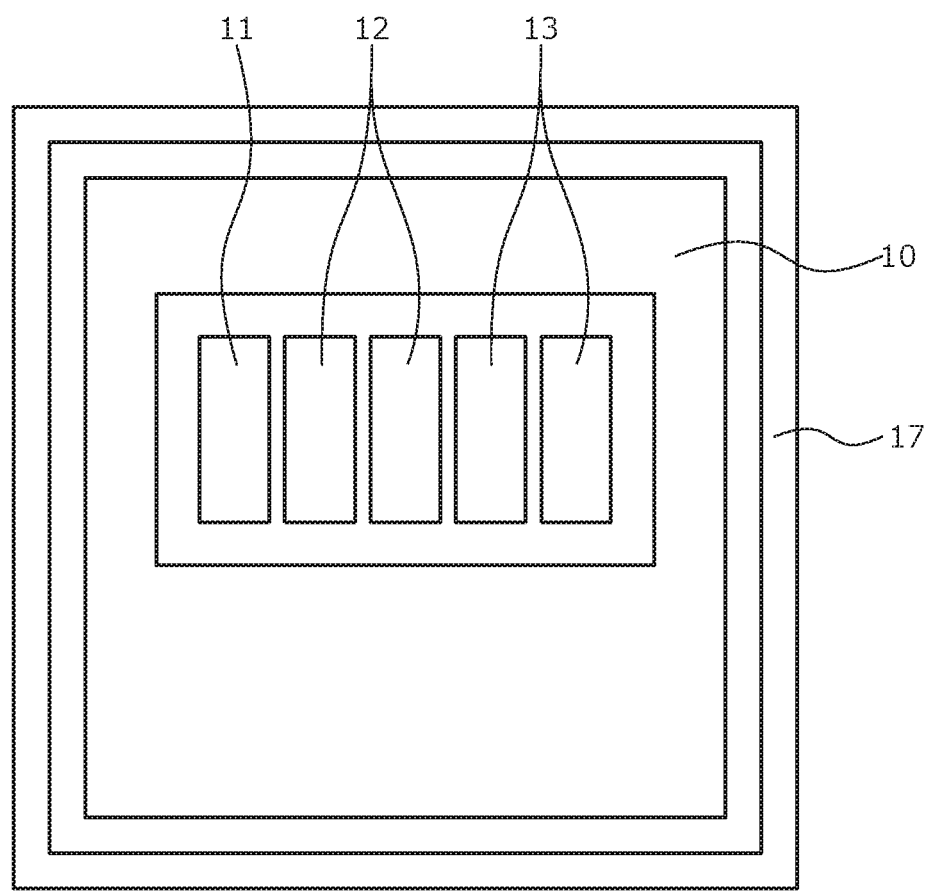
FIG. 3 is a top view of a structure of the silicon carbide semiconductor device according to the first embodiment.
Figure 4:
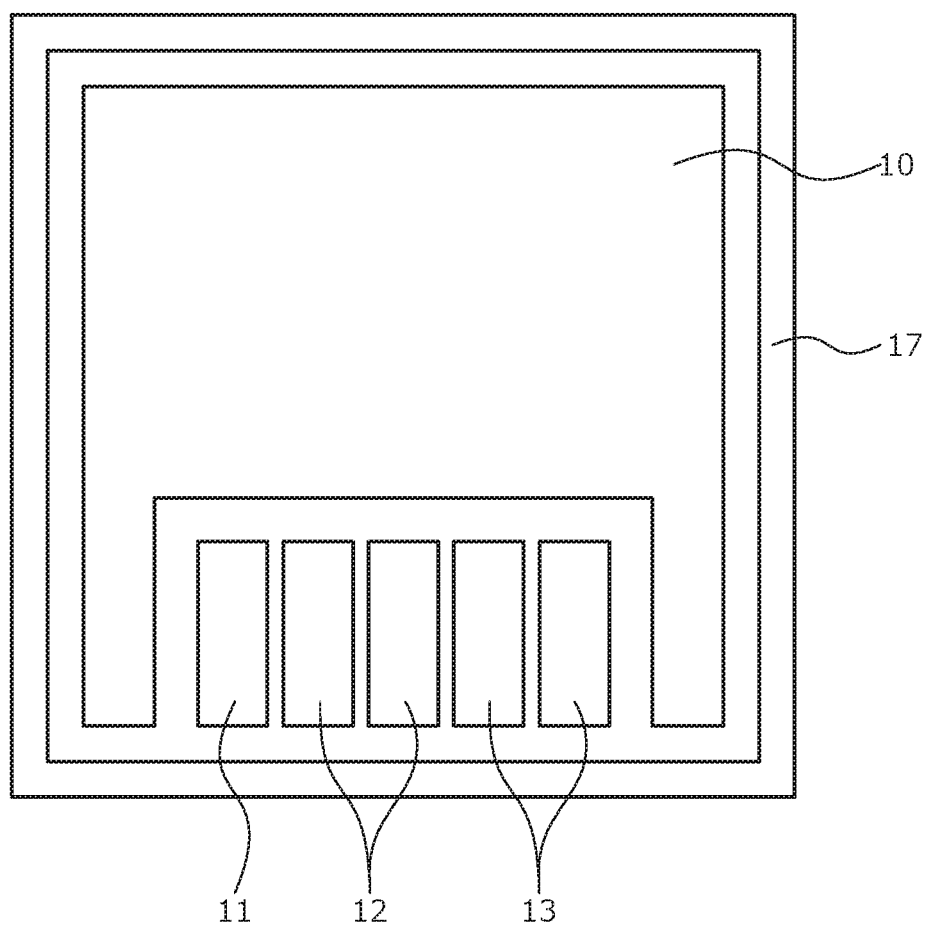
FIG. 4 is a top view of a structure of the silicon carbide semiconductor device according to the first embodiment.
Figure 5:
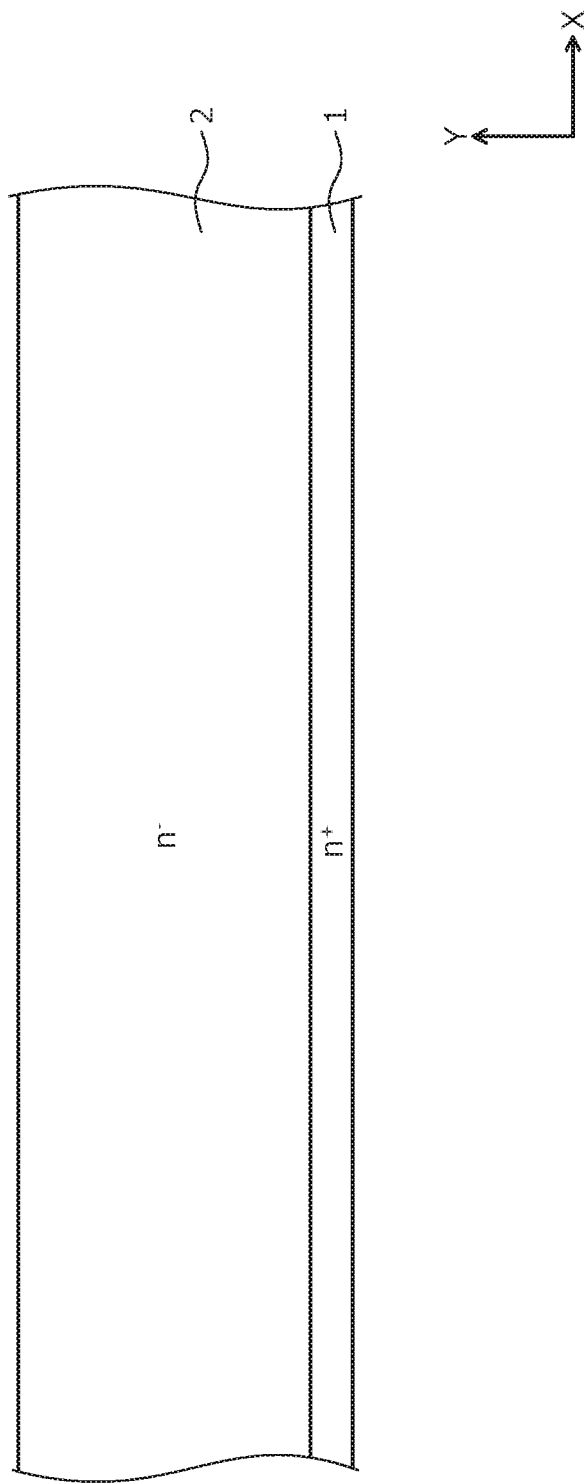
FIG. 5 is a cross-sectional view of the silicon carbide semiconductor device according to the first embodiment during manufacture.
Figure 6:
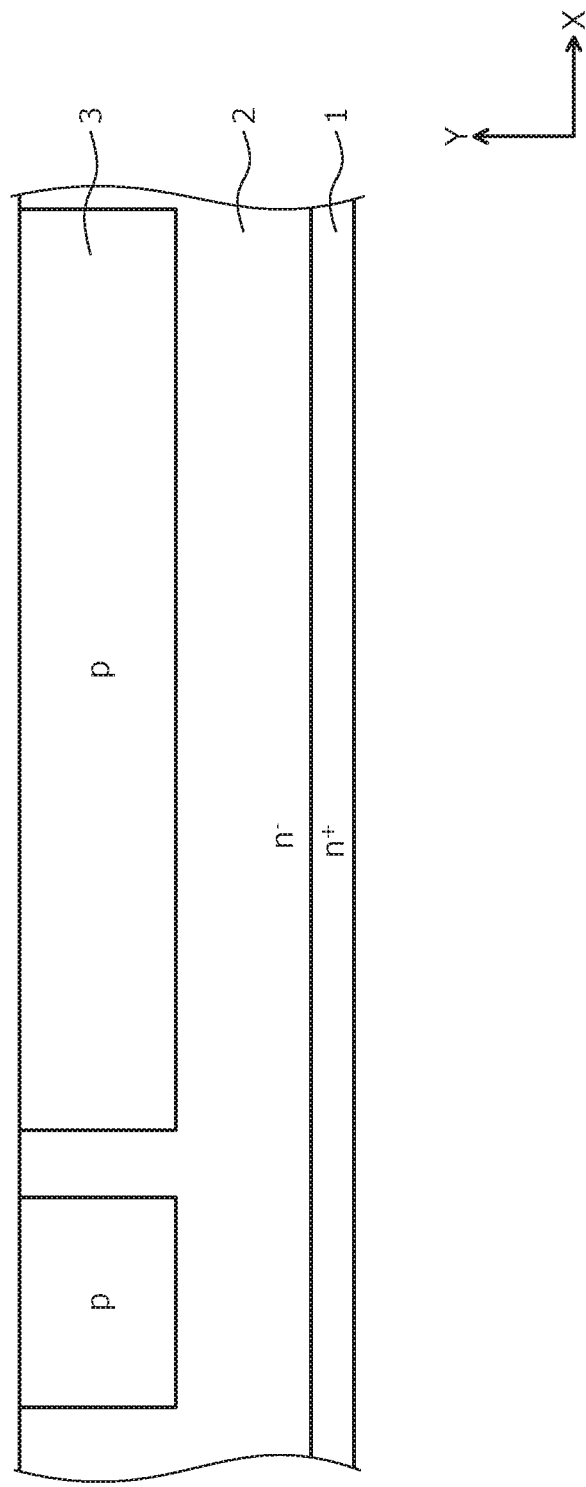
FIG. 6 is a cross-sectional view of the silicon carbide semiconductor device according to the first embodiment during manufacture.
Figure 7:
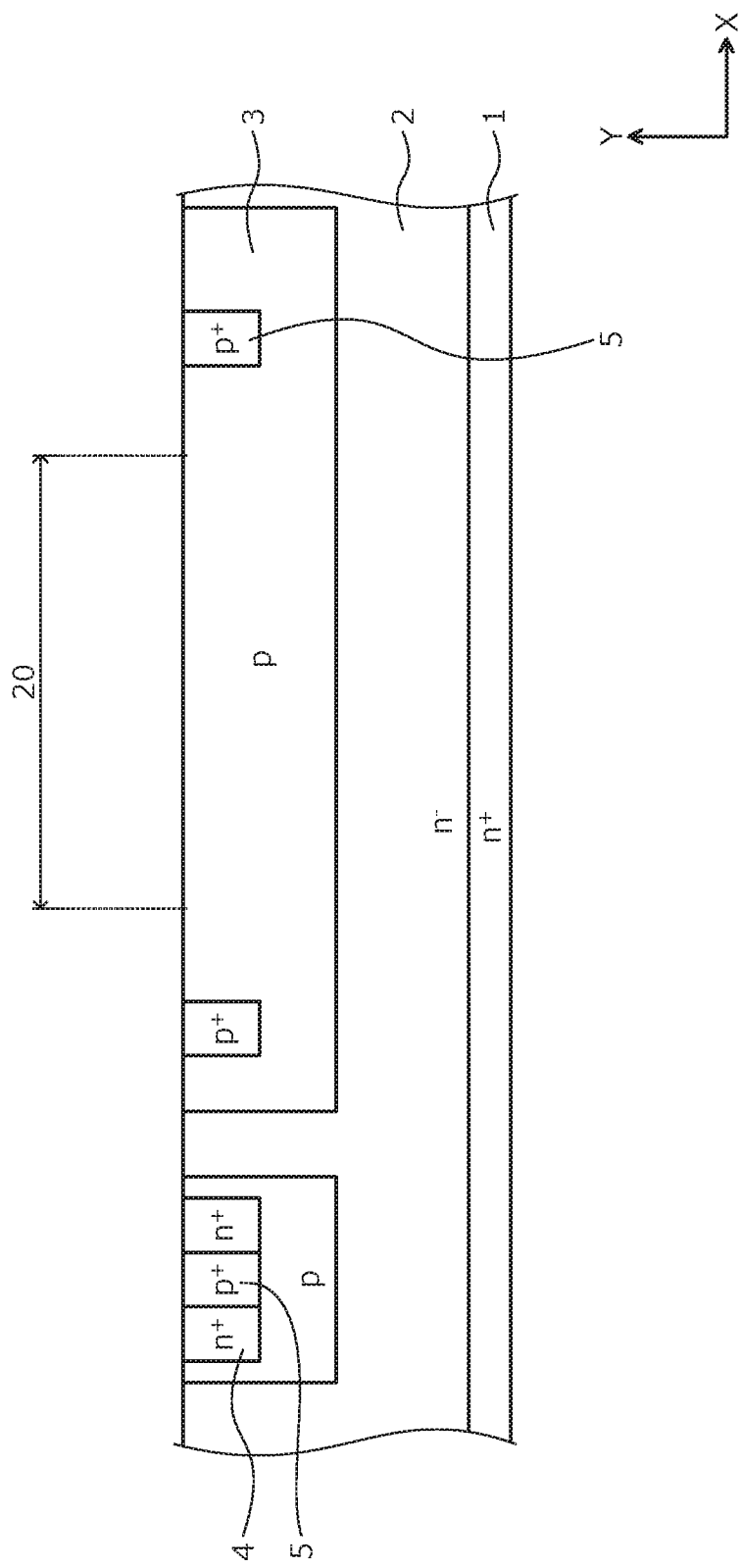
FIG. 7 is a cross-sectional view of the silicon carbide semiconductor device according to the first embodiment during manufacture.
Figure 8:
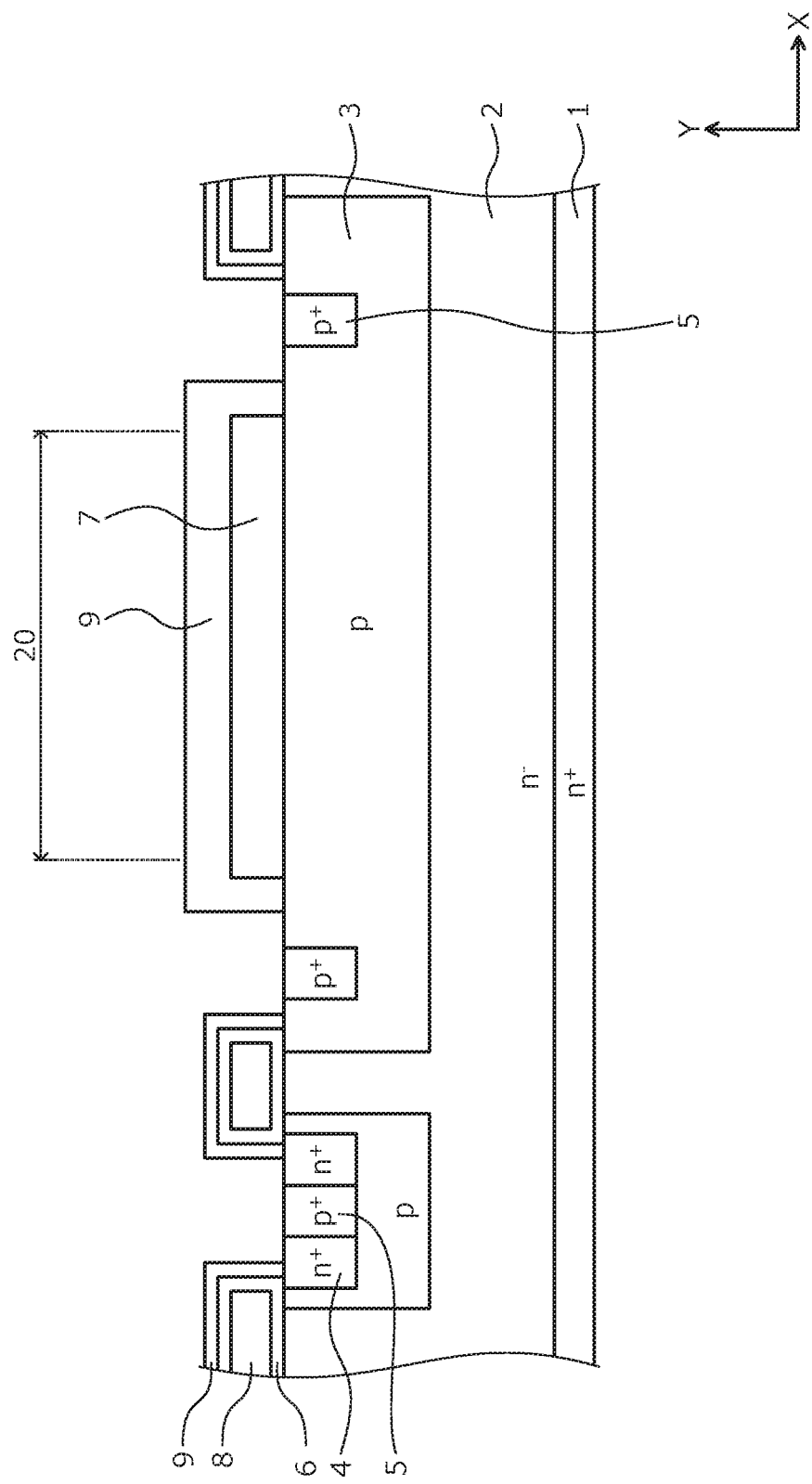
FIG. 8 is a cross-sectional view of the silicon carbide semiconductor device according to the first embodiment during manufacture.

FIGS. 2, 3, and 4 are top views of a structure of the silicon carbide semiconductor device according to the first embodiment. As depicted in FIGS. 2 to 4, a termination structure part 17 that maintains the breakdown voltage is provided surrounding a periphery of the active region in which the source electrode 10 and the gate electrode pad 11 are provided. Here, FIGS. 1A and 1B are cross-sectional views along cutting line A-A' in FIG. 2.

At a central part of an element as depicted in FIG. 3 and at a peripheral part of the element as depicted in FIG. 4, the gate electrode pad 11, a current sensor pad 12 and a temperature sensor pad 13 are each provided singularly or in plural. The current sensor pad 12 and the temperature sensor pad 13 are regions not used as a main element and in which no MOS structure is formed, similarly to the gate pad part 20. Therefore, a region of the silicon carbide semiconductor base opposing these regions in the depth direction may also be of a structure similar to that of the lower region of the gate electrode pad 11. Further, other than the current sensor pad 12 and the temperature sensor pad 13, a region (e.g., arithmetic circuit part) of the silicon carbide semiconductor base opposing in the depth direction, a region not used as a main element and in which no MOS structure is formed may be of a same structure.

A method of manufacturing the silicon carbide semiconductor device according to the first embodiment will be described taking, as an example, a case in which, for example, a 1200V MOSFET is fabricated. FIGS. 5, 6, 7, and 8 are cross-sectional views of the silicon carbide semiconductor device according to the first embodiment during manufacture. First, for example, the n+-type silicon carbide substrate 1 is prepared doped with nitrogen at an impurity concentration of about $2 \times 10^{19}$/cm$^3$. The n+-type silicon carbide substrate 1 may have a main surface that is, for example, a (000-1) plane having an off-angle of about 4 degrees in a <11-20> direction. Next, on the (000-1) plane of the n+-type silicon carbide substrate 1, the n−-type silicon carbide epitaxial layer 2 having a thickness of about 10 μm and doped with nitrogen at an impurity concentration of $1.0 \times 10^{16}$/cm$^3$ is formed by epitaxial growth. The structure here is that depicted in FIG. 5.

Next, by photolithography and etching, an oxide film mask for ion implantation is formed and the p-type base layer 3 is selectively formed by ion implantation in a surface layer of the n−-type silicon carbide epitaxial layer 2. In the ion implantation, for example, aluminum is used as a dopant and a dose amount is set so that an impurity concentration of the p-type base layer 3 is in a range from $1 \times 10^{16}$ to $1 \times 10^{18}$/cm$^3$. The structure here is that depicted in FIG. 6.

Next, by photolithography and ion implantation, the n+-type source region 4 is selectively formed in a surface layer of the p-type base layer 3. Next, by photolithography and ion implantation, the p+-type contact region 5 is selectively formed in the surface layer of the p-type base layer 3. For example, aluminum is used as a dopant and a dose amount is set so that an impurity concentration of the p+-type contact region 5 is in a range from $1 \times 10^{17}$ to $1 \times 10^{19}$/cm$^3$.

Further, the p+-type contact region 5 is formed only in a part of a contact hole of the source electrode 10. Therefore, at the gate pad part 20, in a region (lower region) opposing the gate electrode pad 11 in the depth direction, the p+-type contact region 5 is not formed. As a result, the lower region has a lower carrier recombination rate. The structure here is that depicted in FIG. 7.

Next, heat treatment (annealing) for activating the n+-type source regions 4 and the p+-type contact regions 5 is performed. At this time, a temperature and a period of the heat treatment may be 1620 degrees and 20 minutes, respectively.

The sequence in which the n+-type source region 4 and the p+-type contact region 5 are formed may be variously changed.

Next, the front surface side of the silicon carbide semiconductor base is subject to thermal oxidation, forming an oxide film constituting the gate insulating film 6 and the insulating film 7. The oxide film may be subject to heat treatment at a temperature of 1000 degrees C. in a mixed atmosphere of oxygen (O$_2$) and hydrogen (H$_2$). As a result, regions formed at surfaces of the p-type base layer 3 and the n−-type silicon carbide epitaxial layer 2 are covered by the insulating film 7 and the gate insulating film 6.

Next, on the gate insulating film 6, a polycrystalline silicon layer (poly-silicon (poly-Si) layer) doped with, for example, phosphorus (P) is formed as the gate electrode 8. Next, the polycrystalline silicon layer is patterned and selectively removed, leaving the polycrystalline silicon layer on a part of the p-type base layer 3 sandwiched between the n+-type source region 4 and the n−-type silicon carbide epitaxial layer 2. At this time, the polycrystalline silicon layer on the n−-type silicon carbide epitaxial layer 2 may be left.

Next, as the interlayer insulating film 9, for example, a phosphate glass, such as a phosphosilicate glass (PSG) is deposited so as to cover the gate insulating film 6 and the insulating film 7. A thickness of the interlayer insulating film 9 may be 1.0 μm. Next, the interlayer insulating film 9, the gate insulating film 6, and the insulating film 7 are patterned and selectively removed, forming a contact hole and thereby, exposing the n+-type source region 4 and the p+-type contact region 5. Next, heat treatment (reflow) for planarizing the interlayer insulating film 9 is performed. The structure here is that depicted in FIG. 8.

Next, at a surface of the interlayer insulating film 9 on the gate electrode 8, the source electrode 10 is formed. At this time, the source electrode 10 is further embedded in the contact hole, causing the n+-type source region 4 and the p+-type contact region 5 to be in contact with the source electrode 10. Next, the source electrode 10 other than that of the contact hole is selectively removed.

Next, as the drain electrode 14, for example, a nickel film is deposited at a surface (rear surface of the silicon carbide semiconductor base) of the n+-type silicon carbide substrate 1. Subsequently, heat treatment at a temperature of, for example, 970 degrees C. is performed, forming an ohmic junction between the n$^+$-type silicon carbide substrate 1 and the drain electrode 14. Next, for example, by a sputtering method, an electrode pad constituting the gate electrode pad 11 and a source electrode pad is deposited on the front surface of the silicon carbide semiconductor base overall so as to cover the source electrode 10 and the interlayer insulating film 9. A thickness of a part of the electrode pad on the interlayer insulating film 9 may be, for example, 5 μm. The electrode pad may be formed by, for example, aluminum (Al—Si) containing silicon at a ratio of 1%. Next, the electrode pad is selectively removed.

Next, for example, titanium (Ti), nickel (Ni), and gold (Au) are sequentially deposited on a surface of the drain electrode 14, as the drain electrode pad. Next, a protective film may be formed on the surface. As a result, the MOSFET depicted in FIGS. 1A and 1B is completed.

As described, according to the semiconductor device of the first embodiment, in the gate pad part, a region (lower region) of the silicon carbide semiconductor base opposing the gate electrode pad in the depth direction has a carrier recombination rate that is lower than that of other regions. As a result, when high electric potential is applied to the source electrode and the built-in PN diode is driven, current flowing in the lower region decreases, the concentration of current is reduced and the rate of conductivity modulation decreases, whereby the generation of crystal defects may be reduced. Therefore, without increases in the ON resistance of the semiconductor device due to crystal defects, variation of the threshold voltage Vth of the MOSFET and of the forward voltage Vf of the built-in PN diode may be suppressed, enabling the reliability of the semiconductor device to be maintained.

Figure 9:
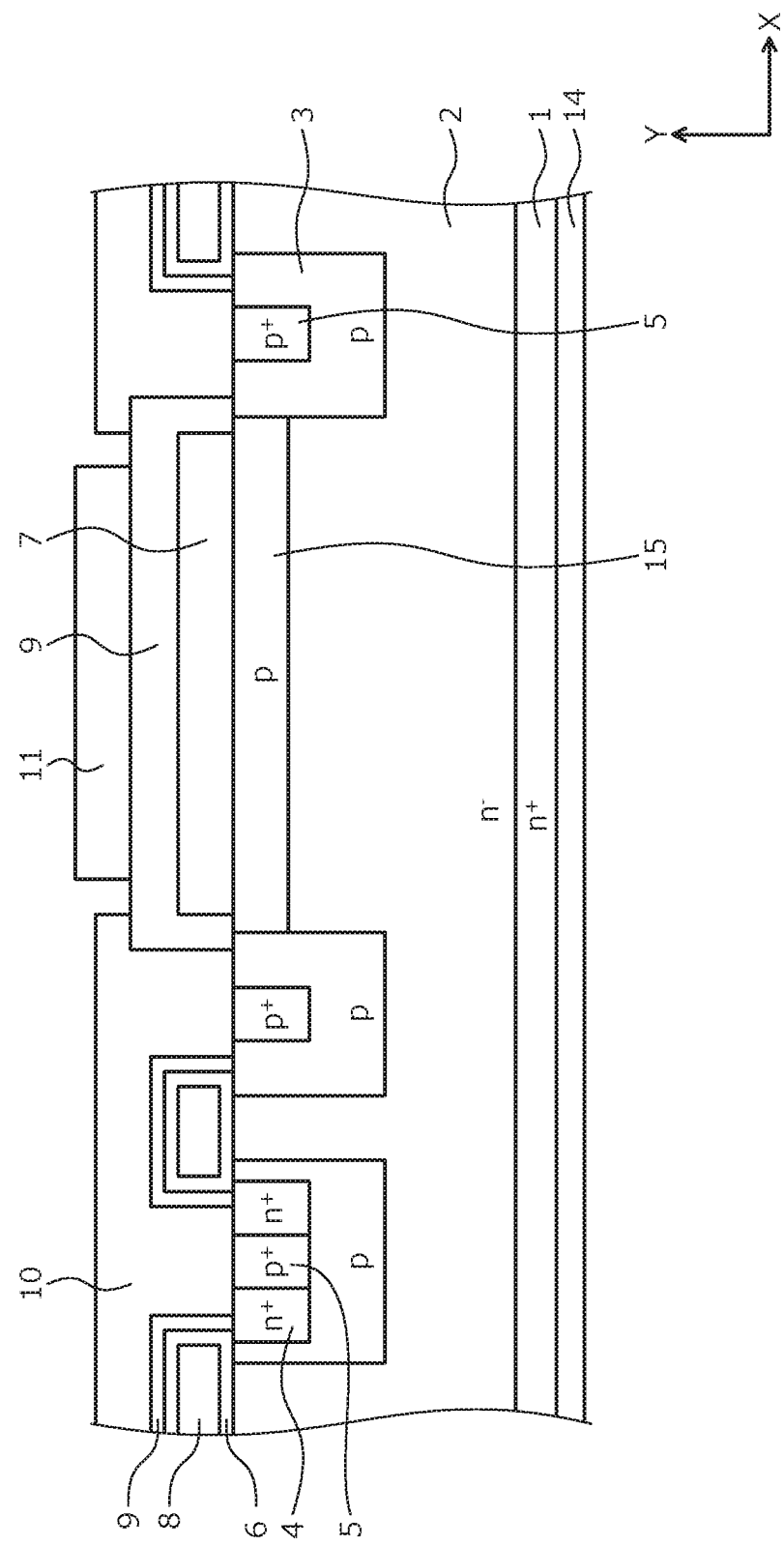
FIG. 9 is a cross-sectional view of a structure of the silicon carbide semiconductor device according to a second embodiment.

A structure of the silicon carbide semiconductor device according to a second embodiment will be described. FIG. 9 is a cross-sectional view of a structure of the silicon carbide semiconductor device according to the second embodiment. As depicted in FIG. 9, the semiconductor device according to the second embodiment differs from the semiconductor device according to the first embodiment in that a p-type silicon carbide layer 15 is provided in the lower region without the p-type base layer 3 being provided in the lower region.

A film thickness of the p-type silicon carbide layer 15 is thinner than a film thickness of the p-type base layer 3 and is about equal to a film thickness of the p$^+$-type contact region 5. Further, the p-type silicon carbide layer 15 is connected with the p-type base layer 3 and an impurity concentration of the p-type silicon carbide layer 15 is in a range from $1 \times 10^{16}$ to $1 \times 10^{18}$/cm$^3$. In this manner, the impurity concentration is set to be about 10 times lower than that of the p$^+$-type contact region 5, whereby the carrier recombination rate in the lower region is decreased. Further, in the second embodiment as well, for example, a lifetime killer region (not depicted) may be provided near an interface of the p-type silicon carbide layer 15 and the n$^-$-type silicon carbide epitaxial layer 2.

A method of manufacturing the silicon carbide semiconductor device according to the second embodiment will be described taking as an example, a case in which, for example, a 1200V MOSFET is fabricated. In the method of manufacturing the semiconductor device according to the second embodiment, first, similarly to the first embodiment, the process of selectively forming the p-type base layer 3 is performed. At this time, in the second embodiment, the p-type base layer 3 is not formed in the lower region.

Next, by photolithography and etching, an oxide film mask for ion implantation is formed, and by ion implantation, the p-type silicon carbide layer 15 is selectively formed in the surface layer of the n$^-$-type silicon carbide epitaxial layer 2. In the ion implantation, for example, aluminum is used as a dopant and a dose amount is set so that an impurity concentration of the p-type silicon carbide layer 15 is in a range from $1 \times 10^{16}$ to $1 \times 10^{18}$/cm$^3$.

Next, similarly to the first embodiment, the process of selectively forming the n$^+$-type source region 4 and subsequent processes are performed, whereby the MOSFET depicted in FIG. 9 is completed. Further, the sequence in which the n$^+$-type source region 4, the p$^+$-type contact region 5, and the p-type silicon carbide layer 15 are formed may be variously changed.

As described, according to the semiconductor device of the second embodiment, similarly to the first embodiment, the lower region has a carrier recombination rate that is lower than that of other regions. Therefore, the second embodiment has effects similar to those of the first embodiment. Further, in the second embodiment, the impurity concentration is 10 times lower due to the p-type silicon carbide layer, whereby the carrier recombination rate of the lower region is reduced, enabling the impurity concentration of the p-type base layer to be increased.

Figure 10:
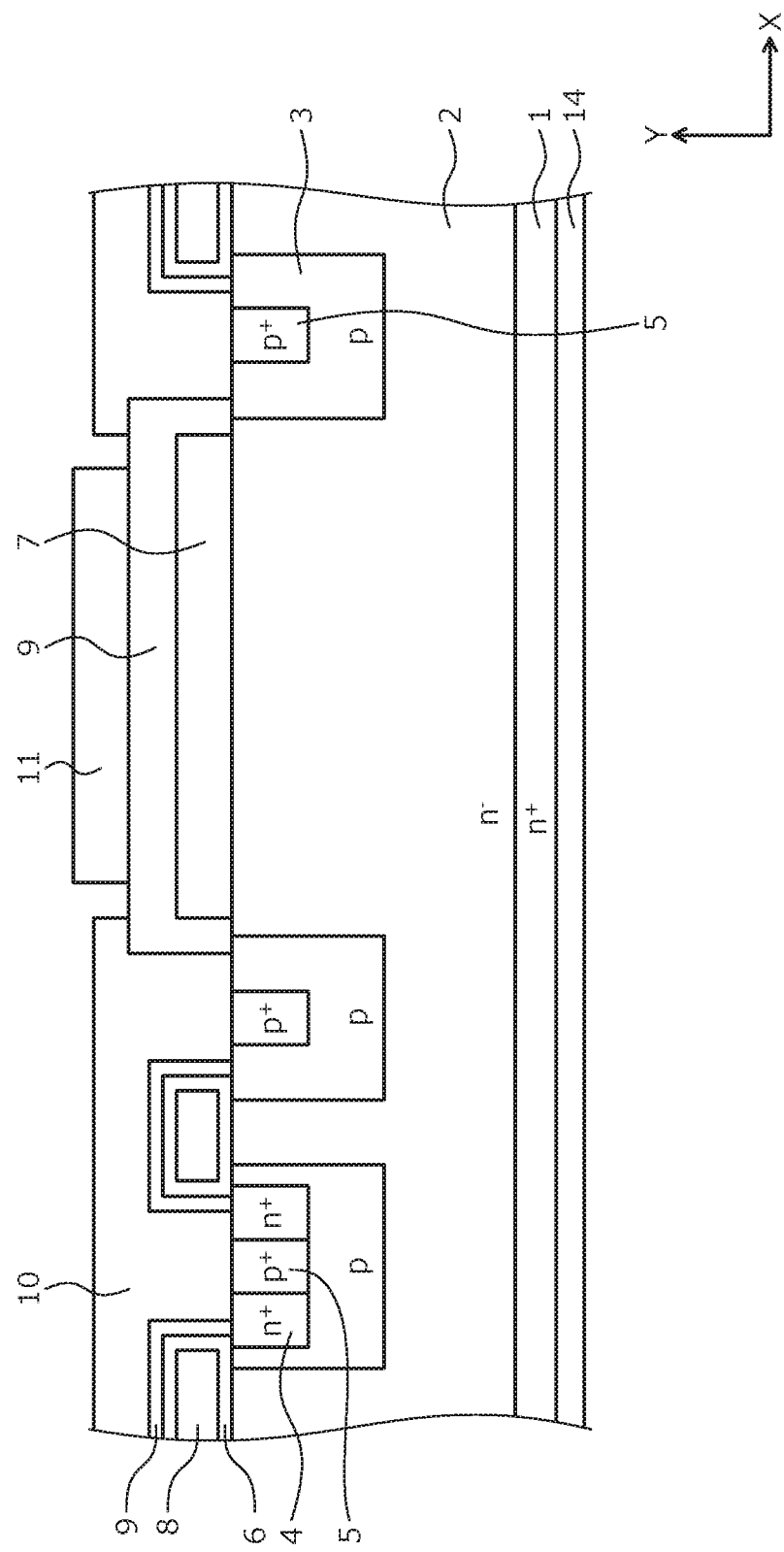
FIG. 10 is a cross-sectional view of a structure of the silicon carbide semiconductor device according to a third embodiment.

A structure of the silicon carbide semiconductor device according to a third embodiment will be described. FIG. 10 is a cross-sectional view of a structure of the silicon carbide semiconductor device according to the third embodiment. As depicted in FIG. 10, the semiconductor device according to the third embodiment differs from the semiconductor device according to the first embodiment in that in the lower region, the n$^-$-type silicon carbide epitaxial layer 2 is provided without the p-type base layer 3 being provided in the lower region.

The impurity concentration of the n$^-$-type silicon carbide epitaxial layer 2 is, for example, about $1.0 \times 10^{16}$/cm$^3$ and therefore, the impurity concentration of the lower region is 10 times lower than the impurity concentration $1 \times 10^{17}$ to $1 \times 10^{19}$/cm$^3$ of the p$^+$-type contact region 5. In this manner, the impurity concentration is set to be 10 times lower, whereby the carrier recombination rate in the lower region is reduced. Further, in the third embodiment as well, for example, the lifetime killer region (not depicted) may be provided in the n$^-$-type silicon carbide epitaxial layer 2.

The silicon carbide semiconductor device according to the third embodiment is manufactured by forming the p-type silicon carbide layer 15 in the method of manufacturing the silicon carbide semiconductor device according to the second embodiment. Therefore, description of the method of manufacturing the silicon carbide semiconductor device according to the third embodiment is omitted hereinafter.

As described, according to the semiconductor device of the third embodiment, similarly to the first embodiment, the lower region has a carrier recombination rate that is lower than that of other regions. Therefore, the third embodiment has effects similar to those of the first embodiment. Further, in the third embodiment, the impurity concentration is 10 times lower due to the type silicon carbide epitaxial layer, whereby the carrier recombination rate of the lower region decreases, enabling the impurity concentration of the p-type base layer to be increased.

Further, in the first to the third embodiments, while a planar-type MOSFET has been described, application to a trench-type MOSFET is further possible by adopting the same structure of the gate pad part 20.

In the embodiments of the present invention, various modifications within a range not departing from the spirit of the invention are possible. For example, dimensions, impurity concentrations, etc. of regions may be variously set according to necessary specifications. Further, in the described embodiments, while a MOSFET has been described as an example, without limitation hereto, wide application is possible to various types of silicon carbide semiconductor devices that conduct and block current by gate driving control based on a predetermined gate threshold voltage. For example, use of a semiconductor substrate of a conductivity type different from that of the MOSFET enables application to an IGBT. Further, in the described embodiments, while a case in which silicon carbide is used as a wide-bandgap semiconductor material is described as an example, application is further possible to a wide-bandgap semiconductor material other than silicon carbide such as, for example, gallium nitride (GaN). Further, in the embodiments, while the first conductivity type is assumed to be an n-type and the second conductivity type is assumed to be a p-type, the present invention is similarly implemented when the first conductivity type is a p-type and the second conductivity type is an n-type.

According to the embodiments of the invention, in the gate pad part, a region (lower region) of the silicon carbide semiconductor base opposing the gate electrode pad in the depth direction has a carrier recombination rate that is lower than that of other regions. As a result, when high electric potential is applied to the source electrode and the built-in PN diode is driven, current flowing in the lower region decreases, the concentration of current is reduced and the rate of conductivity modulation decreases, whereby the generation of crystal defects may be reduced. Therefore, without increases in the ON resistance of the semiconductor device due to crystal defects, variation of the threshold voltage Vth of the MOSFET and of the forward voltage Vf of the built-in PN diode may be suppressed, enabling the reliability of the semiconductor device to be maintained.

The semiconductor device and the method of manufacturing a semiconductor device according to the embodiments of the invention achieve an effect in that when high electric potential is applied to the source electrode and the built-in PN diode is driven, the generation of crystal defects may be suppressed.

As described, the semiconductor device and the method of manufacturing a semiconductor device according to the embodiments are useful for high-voltage semiconductor devices used in power converting equipment and in power supply devices used in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate of a first conductivity type;
a first semiconductor layer of the first conductivity type, provided on a front surface of the semiconductor substrate, the first semiconductor layer having an impurity concentration that is lower than that of the semiconductor substrate;
a second semiconductor layer of a second conductivity type, selectively provided in a surface layer of the first semiconductor layer on a first side of the first semiconductor layer, opposite a second side of the first semiconductor layer facing toward the semiconductor substrate;
a first semiconductor region of the first conductivity type, selectively provided in a surface layer of the second semiconductor layer on a first side of the second semiconductor layer, opposite a second side of the second semiconductor layer facing toward the semiconductor substrate;
a second semiconductor region of the second conductivity type, selectively provided in the surface layer of the second semiconductor layer on the first side of the second semiconductor layer, the second semiconductor region having an impurity concentration that is higher than that of the second semiconductor layer;
a gate electrode provided, via a gate insulating film, at least at a part of a surface of the second semiconductor layer sandwiched between the first semiconductor region and the first semiconductor layer;
a first electrode provided on surfaces of the first semiconductor region and the second semiconductor layer;
a second electrode provided on a rear surface of the semiconductor substrate; and
a gate electrode pad electrically connected with the gate electrode,
wherein
a lifetime killer region, in which a lifetime killer is introduced, is provided at an interface of the second semiconductor layer and the first semiconductor layer, the lifetime killer region being provided at least partially in a portion of the second semiconductor layer disposed below the gate electrode pad and being excluded from the second semiconductor layer disposed below the first semiconductor region.

2. The semiconductor device according to claim 1, wherein
the second semiconductor layer is provided below the gate electrode pad and the second semiconductor region is not provided below the gate electrode pad, and
an impurity concentration of the second semiconductor layer is at least 10 times lower than that of the second semiconductor region.

3. The semiconductor device according to claim 1, further comprising a third semiconductor layer of the second conductivity type, selectively provided below the gate electrode pad, the third semiconductor layer being provided in the surface layer of the first semiconductor layer on the first side of the first semiconductor layer, the third semiconductor layer having an impurity concentration that is at least 10 times lower than that of the second semiconductor region, and
the third semiconductor layer is thinner than the second semiconductor layer.

4. The semiconductor device according to claim 3, wherein
the third semiconductor layer has a depth equal to that of the second semiconductor region in an active region in which main current flows during an ON state, the third semiconductor layer surrounding the gate electrode pad.

5. The semiconductor device according to claim 1, wherein
the first semiconductor layer is provided under the gate electrode pad.

6. The semiconductor device according to claim 1, wherein, in an active region in which main current flows during an ON state, a first region is not used as a main element, and the lifetime killer region is provided at least partially in a portion of the second semiconductor layer disposed in a second region opposing the first region in the depth direction.

7. The semiconductor device according to claim 6, wherein the first region includes a current sensor pad part, a temperature sensor pad part and an arithmetic circuit part.

8. The semiconductor device according to claim 1, wherein the lifetime killer region is provided so as to overlap, in a depth direction, an entirety of the second semiconductor layer disposed below the gate electrode pad.

9. The semiconductor device according to claim 1, wherein the lifetime killer includes gold or platinum.

10. A method of manufacturing a semiconductor device, the method comprising:

forming a first semiconductor layer of a first conductivity type on a front surface of a semiconductor substrate of the first conductivity type, the first semiconductor layer having an impurity concentration that is lower than that of the semiconductor substrate;

selectively forming a second semiconductor layer of a second conductivity type in a surface layer of the first semiconductor layer on a first side of the first semiconductor layer, opposite a second side of the first semiconductor layer facing toward the semiconductor substrate;

selectively forming a first semiconductor region of the first conductivity type in a surface layer of the second semiconductor layer on a first side of the second semiconductor layer, opposite a second side of the second semiconductor layer facing toward the semiconductor substrate;

selectively forming a second semiconductor region of the second conductivity type in the surface layer of the second semiconductor layer on the first side of the second semiconductor layer, the second semiconductor region having an impurity concentration that is higher than that of the second semiconductor layer;

introducing a lifetime killer to form a lifetime killer region which is provided at an interface of the second semiconductor layer and the first semiconductor layer;

forming, via a gate insulating film, a gate electrode at least at a part of a surface of the second semiconductor layer sandwiched between the first semiconductor region and the first semiconductor layer;

forming a first electrode on surfaces of the first semiconductor region and the second semiconductor layer;

forming a second electrode on a rear surface of the semiconductor substrate; and forming a gate electrode pad electrically connected with the gate electrode, wherein the lifetime killer region is provided at least partially in a portion of the second semiconductor layer disposed below the gate electrode pad and is excluded from the second semiconductor layer disposed below the first semiconductor region.

* * * * *